(12) United States Patent
Farber et al.

(10) Patent No.: US 6,187,684 B1
(45) Date of Patent: Feb. 13, 2001

(54) METHODS FOR CLEANING SUBSTRATE SURFACES AFTER ETCH OPERATIONS

(75) Inventors: Jeffrey J. Farber, Delmar, NY (US); Allan M. Radman, Aptos; Helmuth W. Treichel, Milpitas, both of CA (US)

(73) Assignee: Lam Research Corporation, Fremont, CA (US)

( * ) Notice: Under 35 U.S.C. 154(b), the term of this patent shall be extended for 0 days.

(21) Appl. No.: 09/458,550

(22) Filed: Dec. 9, 1999

(51) Int. Cl.[7] .................................................. H01L 21/302
(52) U.S. Cl. ........................................... 438/704; 438/745
(58) Field of Search .................................... 438/694, 695, 438/710, 723, 210, 704, 706, 722, 745, 756

(56) References Cited

U.S. PATENT DOCUMENTS 6,004,839 * 12/1999 Hayashi et al. ...................... 438/210
6,024,106 * 2/2000 Yang et al. ........................... 134/1.3

* cited by examiner

*Primary Examiner*—Matthew Smith
*Assistant Examiner*—Calvin Lee
(74) *Attorney, Agent, or Firm*—Martine Penilla & Kim, LLP

(57) ABSTRACT

A method for post plasma etch cleaning a semiconductor wafer is provided. The semiconductor wafer has a plurality of layers formed thereon, and one of the plurality of layers is an oxide layer that has an overlying photoresist mask. The method includes plasma etching a via feature in the oxide layer. The plasma etching is configured to generate a polymer film on sidewalls of the via feature. An ashing operation is then performed to remove the photoresist mask. The method then moves to brush scrubbing the oxide layer and the via feature defined in the oxide layer with first chemicals in a first brush station. Brush scrubbing the oxide layer and the via feature follows with DI water in the first brush station. Then, the oxide layer and the via feature are brush scrubbed with second chemicals in a second brush station. In the same second brush station, the oxide layer and the via feature are scrubbed with DI water. The brush scrubbing in the first and second brush stations is configured to remove the polymer film from the side walls of the via feature.

22 Claims, 8 Drawing Sheets

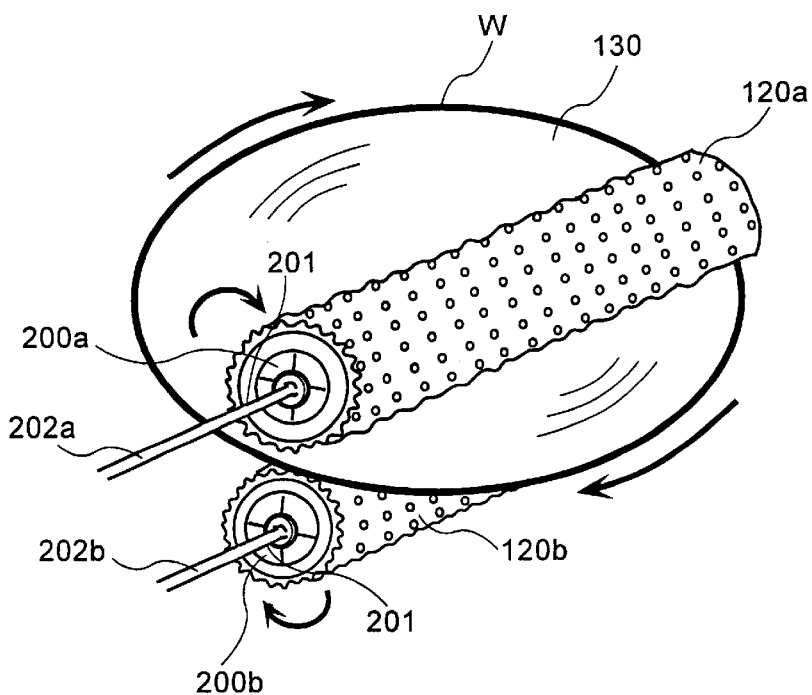
FIG. 2A
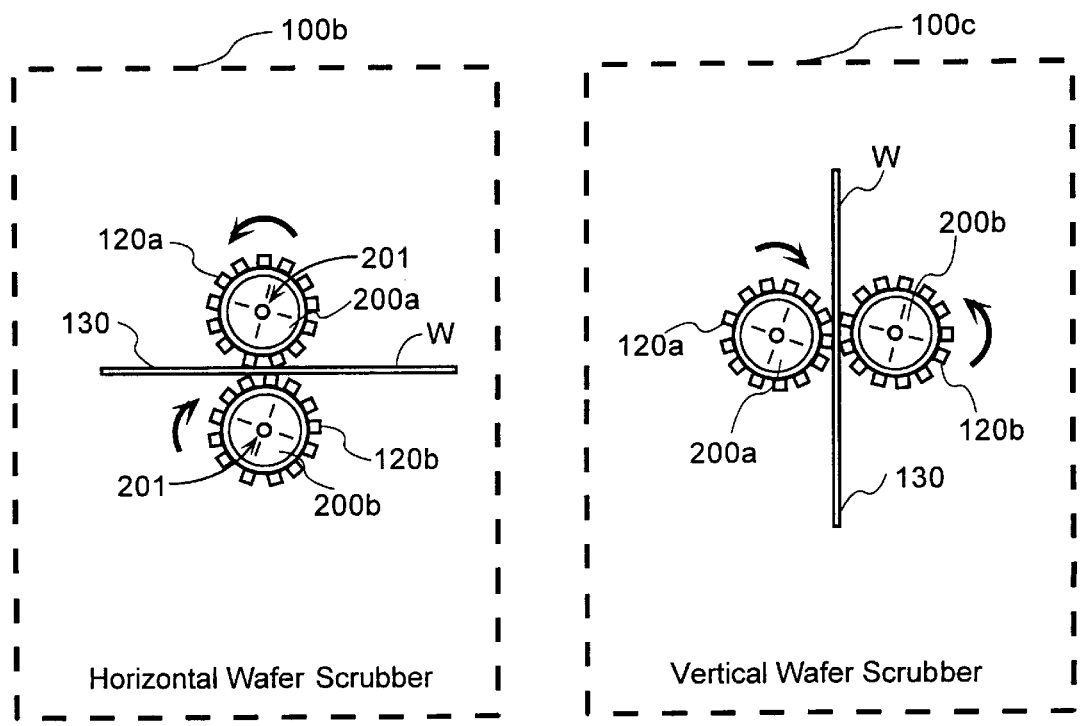
FIG. 2B
FIG. 2C

METHODS FOR CLEANING SUBSTRATE SURFACES AFTER ETCH OPERATIONS

BACKGROUND OF THE INVENTION

1. Field of the Invention

This invention relates generally to substrate fabrication, and more particularly to semiconductor wafer cleaning after etch operations.

2. Description of the Related Art

As is well known, semiconductor devices are fabricated from semiconductor wafers, which are subjected to numerous processing operations. These operations include, for example, impurity implants, gate oxide generation, inter-metal oxide depositions, metallization depositions, photolithography pattering, etching operations, chemical mechanical polishing (CMP), etc.

To facilitate discussion, FIG. 1 illustrates a cross-section view of a layer stack, representing the layers formed during the fabrication of a typical semiconductor integrated circuit (IC) device. It should be noted that additional layers above, below, or between the layers shown may be present. Further, not all of the illustrated layers need necessarily be present and some or all may be substituted by a variety of different layers.

At the bottom of the layer stack, there is shown a substrate 10. An oxide layer 11 which is typically a silicon dioxide ($SiO_2$) is shown formed over the surface of the substrate 10. A barrier layer 12, typically formed of Ti, TiW, TiN or other suitable barrier materials, may be disposed between oxide layer 11 and a subsequently deposited metallization layer 13. Barrier layer 12, when provided, functions to substantially prevent diffusion of silicon atoms from oxide layer 11 and into the metallization layer 13.

Metallization layer 13 typically includes aluminum, copper or one or more of a variety of known aluminum alloys such as Al—Cu, Al—Si, and Al—Cu—Si. Also shown is an anti-reflective coating (ARC) layer 14 that is formed over metallization layer 13. As is well known in the art, ARC layer 14 is typically composed of Ti, TiN or TiW. Generally speaking, ARC layer 14 is useful in preventing light used in photolithography processes from reflecting and scattering off of the metallization layer 13 surface. Another oxide layer 16 is then formed over the ARC layer 14. In this simplified example, a photoresist layer 18 is then spin coated over the oxide layer 16 and patterned to define windows where etching is desired. As is well known, photoresist layer 18 represents a layer of conventional photo-sensitive resist material that may be patterned using patterned reticles and a stepper that passes selective light waves onto the surface of photoresist layer 18. The layers of the layer stack are readily recognizable to those skilled in the art and may be formed using any number of known deposition processes, including chemical vapor deposition (CVD), plasma-enhanced chemical vapor deposition (PECVD), physical vapor deposition (PVD) such as sputtering, spin coating, etc.

At this point, an etch operation 20 is performed in order to selectively remove portions of the oxide 16. In this example, a feature 17 is etched into the oxide 16, and the feature 17 may be a trench, a via hole, or any other geometric pattern. Preferably, the etch 20 is chosen to have good selectivity to enable efficient etching of the oxide 16. During the etching operation, however, polymer formation 22 is known to occur on the sidewalls of features 17 being etched. This polymer formation 22, as shown, typically takes on the shape of a crown or a veil. This shape therefore is observed to extend along the sidewalls and up onto the photoresist layer 18.

The actual composition of the polymer formation 22 depends upon the material being etched, the chemistry used for the etching, and the underlying material (e.g., the ARC layer 14). Although there are many types of chemistries used to plasma etch through an oxide layer 16, typical chemistries may include $CF_4$ and $O_2$, $NF_3$, and $C_4F_8$ among others. Thus, the material representing the polymer formation 22 will generally be an oxide material containing some of the etch chemistry components, carbon from the photoresist, and metallization material (e.g., Ti, TiN, Al, Si, and Cu) from the ARC layer 14 and the metal layer 13.

After the plasma etching is performed, the conventional process is to perform what is referred to as an ashing operation to remove the photoresist layer 18. This ashing operation may remove some of the polymer formation 22, however, most may still remain on the sidewalls of the etched oxide layer 16. To remove this remaining polymer formation 22, it is conventional practice to move the wafer into a chemical bath containing liquids that are designed to remove the polymer formation 22. An example chemical bath may include a chemical referred to as EKC-265, which is available from EKC, Inc. of Hayward, Calif.

Although chemical bath rinsing has worked in the past, the demand for smaller device features has increased the need to have a very clean environment at every step of a fabrication process. Unfortunately, bath rinsing is inherently an unclean environment. Polymer material being rinsed in the bath may therefore contaminate the bath, and the removed material may be deposited or can attach to other parts of a wafer or to other wafers being processed through the bath. In some cases, the polymer formation 22 material may become lodged at the base of an etched feature, and due to its oxide composition, the material may prevent electrical contact through that feature (e.g., once a next metal formation step is performed to fill the oxide etched feature). Accordingly, surface particles and contaminants can detrimentally impact the performance of an integrated circuit device.

In view of the foregoing, there is a need for improved methods that will enable efficient removal of post plasma etch polymer materials from etched features. The removal should be efficient enough to remove the polymer material and prevent further contamination of other surface areas of a wafer being processed.

SUMMARY OF THE INVENTION

Broadly speaking, the present invention fills these needs by providing methods for efficiently cleaning etched features of given layers of a semiconductor wafer. Preferably, the cleaning is designed to efficiently remove post plasma etch polymers from etched features. It should be appreciated that the present invention can be implemented in numerous ways, including as a process, an apparatus, a system, a device, or a method. Several inventive embodiments of the present invention are described below.

In one embodiment, a method for cleaning a semiconductor wafer after process operations is disclosed. The method includes plasma etching a feature in an oxide layer having a photoresist mask. Then, the semiconductor wafer is processed through an ashing operation to remove the photoresist mask. The semiconductor wafer is then scrubbed implementing chemicals that are configured to remove polymer residues deposited in and around the feature during the plasma etching. In a preferred embodiment, the chemicals are selected from one of: (a) a combination of $NH_4OH$ and DI water, (b) a combination of $H_2O_2$, HF, and DI water, (c)

a combination of $O_2$, $NH_4OH$, and DI water, and (d) a combination of HF and DI water.

In another embodiment, a method for post plasma etch cleaning a semiconductor wafer is disclosed. The semiconductor wafer has a plurality of layers formed thereon, and one of the plurality of layers is an oxide layer that has a photoresist mask. The method includes plasma etching a feature in the oxide layer. The plasma etching is configured to generate a polymer film on sidewalls of the plasma etched feature. An ashing operation is then performed to remove the photoresist mask. The oxide layer and the plasma etched feature are then brush scrubbed with chemicals followed by a DI water rinse. The chemicals are defined to be a combination of $H_2O_2$, $NH_4OH$, and DI water, and the brush scrubbing is configured to remove the polymer film from the sidewalls of the plasma etched feature. Still further, the chemicals can also be dilute HF.

In yet a further embodiment, a method for post plasma etch cleaning a semiconductor wafer is disclosed. The semiconductor wafer has a plurality of layers formed thereon, and one of the plurality of layers is an oxide layer that has an overlying photoresist mask. The method includes plasma etching a via feature in the oxide layer. The plasma etching is configured to generate a polymer film on sidewalls of the via feature. An ashing operation is then performed to remove the photoresist mask. The method then moves to brush scrubbing the oxide layer and the via feature defined in the oxide layer with first chemicals in a first brush station. Brush scrubbing the oxide layer and the via feature follows with DI water in the first brush station. Then, the oxide layer and the via feature are brush scrubbed with second chemicals in a second brush station. In the same second brush station, the oxide layer and the via feature are scrubbed with DI water. The brush scrubbing in the first and second brush stations is configured to remove the polymer film from the side walls of the via feature.

As an advantage, because post plasma etch cleaning is performed by way of a brush scrubber, the resulting wafer surface will be substantially cleaner than previously possible using chemical baths. Furthermore, the polymer material in via holes (e.g., sometimes being about 1–2 nm) is completely removed. Thus, the combination of mechanical force (e.g., brush clean) and cleaning chemistries assures removal of residuals (e.g., veils and crowns) from post via and feature plasma etching. Thus, the methods of the present invention provide for an efficient and simple way of cleaning wafers after plasma etching operations, and the resulting clean wafers advantageously improve yield.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2A illustrates a simplified three-dimensional diagram of a pair of brushes scrubbing a top surface and a bottom surface of a wafer, in accordance with one embodiment of the present invention.

FIGS. 2B and 2C illustrate cross-sectional views of two different orientations for scrubbing a wafer in accordance with one embodiment of the present invention.

DETAILED DESCRIPTION OF THE PREFERRED EMBODIMENTS

An invention is described for methods of efficiently cleaning etched features of given layers of a semiconductor wafer. Preferably, the cleaning is designed to efficiently remove post plasma etch polymers and other particulates from in and around etched features. It will be obvious, however, to one skilled in the art, that the present invention may be practiced without some or all of these specific details. In other instances, well known process operations have not been described in detail in order not to unnecessarily obscure the present invention.

The following description provided with reference to FIGS. 1B through 2C will introduce exemplary preparation units and their respective orientations in which substrates can be processed. The flowcharts of FIGS. 3 through 6 will then describe exemplary method operations that can be performed to clean wafers after etch operations. In one embodiment, the methods of the present invention enable efficient cleaning of polymers deposited during etching operations and other operations that may produce particulates or contaminants.

Figure 1A:
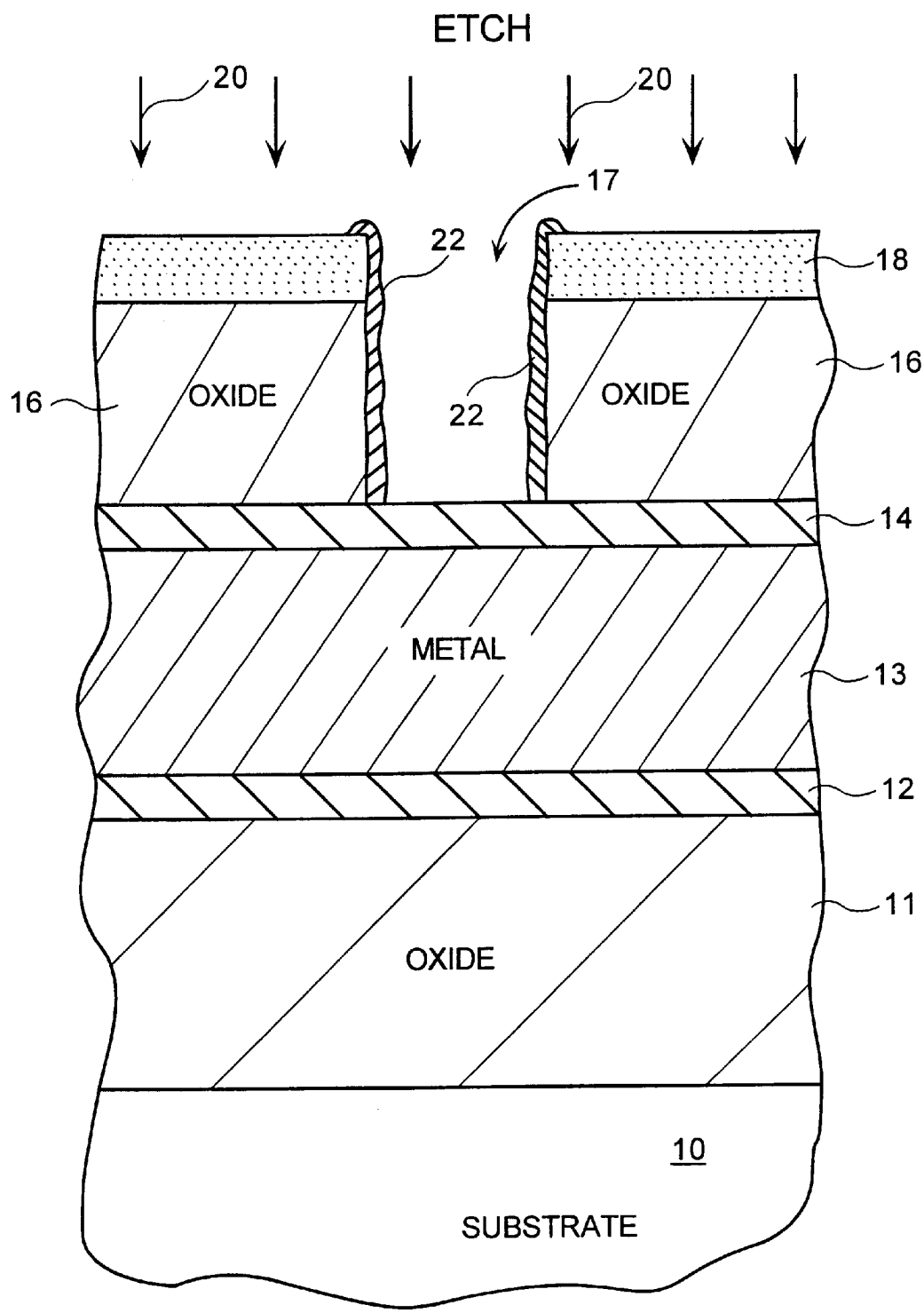
FIG. 1A provides a diagram of a semiconductor wafer having layers formed thereon and an associated plasma etching operation.
Figure 1B:
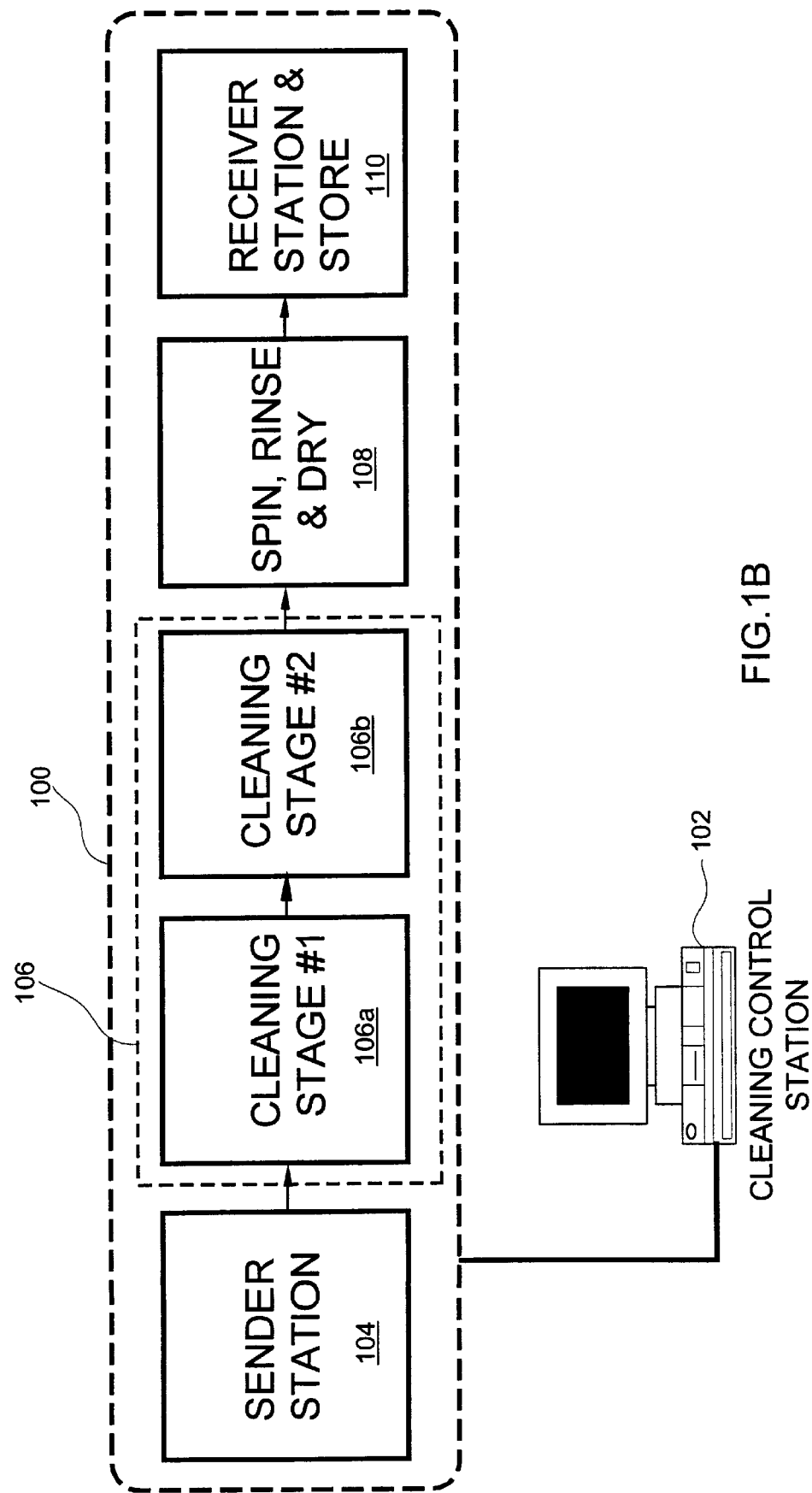
FIG. 1B shows a wafer cleaning station of the present invention that may be controlled in an automated way by a cleaning control station.

FIG. 1B shows a wafer cleaning station 100 of the present invention that may be controlled in an automated way by a cleaning control station 102. The wafer cleaning station 100 includes a sender station 104, a cleaning stage 106, a spin-rinse and dry (SRD) station 108, and a receiver station 110. It should be understood that cleaning systems can be used to carry out different kinds of substrate preparation operations, such as, cleaning, etching, buffing, and the like. With this in mind, as a broad overview of a cleaning process, semiconductor wafers are initially placed into the sender station 104. The sender station 104 then delivers wafers (one-at-a-time) to the cleaning stage 106. In one embodiment, the cleaning stage 106 is divided into a first cleaning stage 106a and a second cleaning stage 106b, although having just one cleaning stage 106 will also work. After passing through the cleaning stage 106, the wafer is passed through an exit spray in order to remove the cleaning fluids and any contaminants. The SRD station 108 dries the wafer and then it is delivered to the receiver station 110 for temporary storage.

Figure 1C:
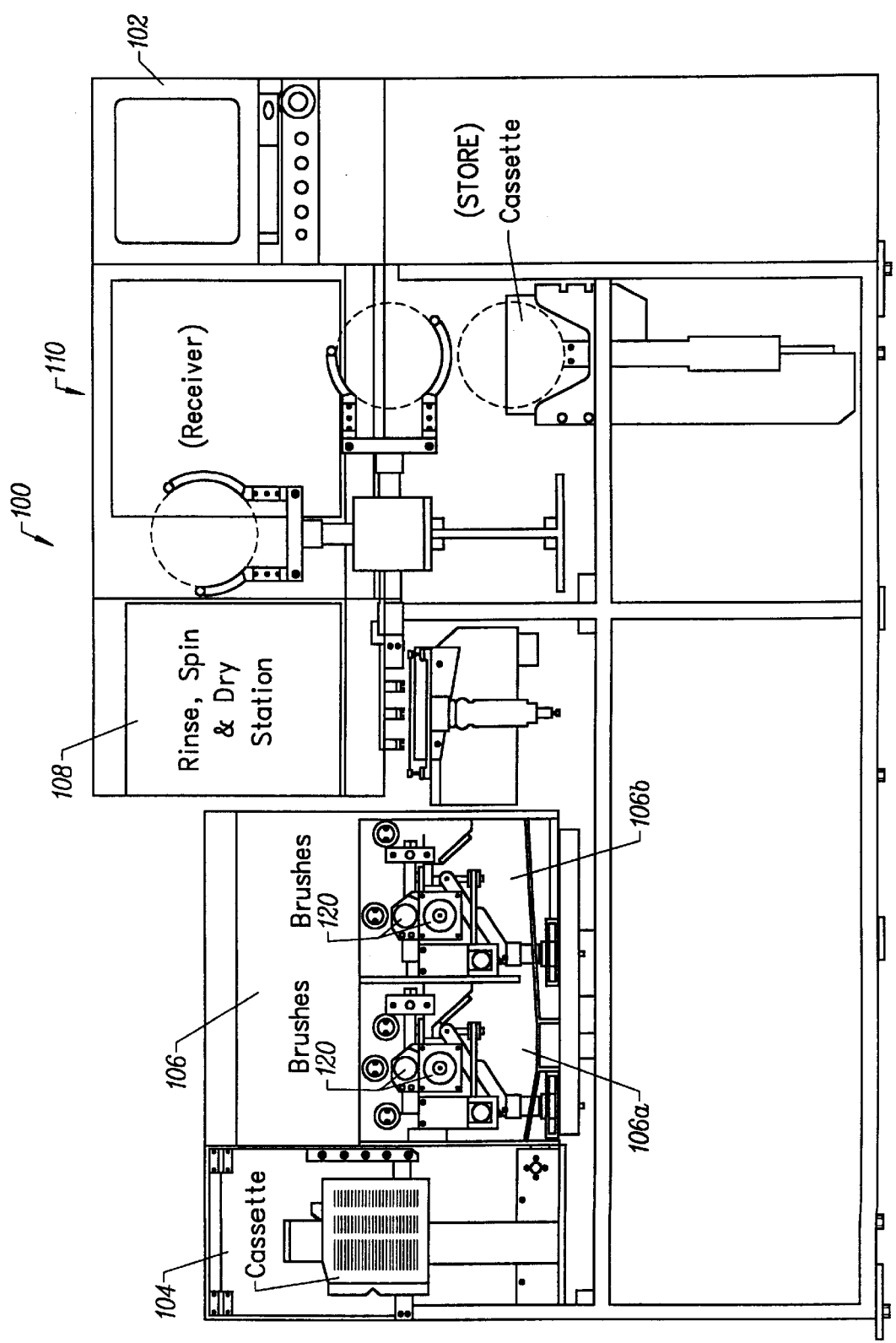
FIG. 1C shows a more detailed schematic of an exemplary wafer cleaning station, in accordance with one embodiment of the present invention.

FIG. 1C shows a more detailed schematic of an exemplary wafer cleaning station 100. Both the sender station 104 and the receiving station 110 are preferably adapted to receive a cassette containing a number of wafers. The first and second cleaning stages 106a and 106b preferably include a set of polyvinyl alcohol (PVA) brushes 120 that are very soft and porous. As is well known, the brushes 120 are capable of scrubbing the wafer without damaging the delicate surface.

FIG. 2A illustrates a simplified three-dimensional diagram of a pair of brushes 120a and 120b for scrubbing a top surface and a bottom surface, respectively, of a wafer 130. Typically, the wafer 130 is caused to rotate in a particular direction while the brushes 120 rotate around an axis of rotation and the surface of the brushes 120 are in contact with the surfaces of the wafer 130. The brushes 120a and 120b are mounted on brush cores 200a and 200b. The brush cores 200 are configured to have a shaft 201 which has a fluid inlet 202. The fluid inlet 202 will thus supply the desired fluids into the brush cores 200. The brush cores 200 preferably have a plurality of holes that will allow the fluids to uniformly exit the brush core 200 and evenly supply the desired fluid to the brush 120.

FIGS. 2B and 2C illustrate cross-sectional views of two different orientations for scrubbing a wafer 130, in accordance with one embodiment of the present invention. As shown in FIG. 2B, the wafer is held horizontally while a top brush 120a scrubs the top surface of the wafer 130, and a bottom brush 120b scrubs the bottom surface of the wafer 130. As mentioned above, the wafer 130 is configured to rotate (using rollers not shown) at the same time that the brushes 120 rotate to ensure that the entire surface area of the wafer is properly scrubbed to remove contaminants, etch the surface to a desired degree, or buff the surface. Thus, FIG. 2B illustrates a horizontal wafer scrubber 100b.

In contrast, FIG. 2C illustrates a vertical wafer scrubber 100c in which the wafer 130 is scrubbed while in a vertical position. Typically, the wafer 130 sits on a pair of rollers of the scrubber 100c. The brushes 120 are configured to rotate in a desired direction such that both sides of the wafer 130 are evenly scrubbed, using an equal and opposite pressure on each side of the wafer 130. For more information on vertical wafer scrubbing, reference may be made to U.S. Pat. No. 5,875,507, having inventors Stephens et al., entitled "Wafer Cleaning Apparatus," which is hereby incorporated reference.

Figure 3:
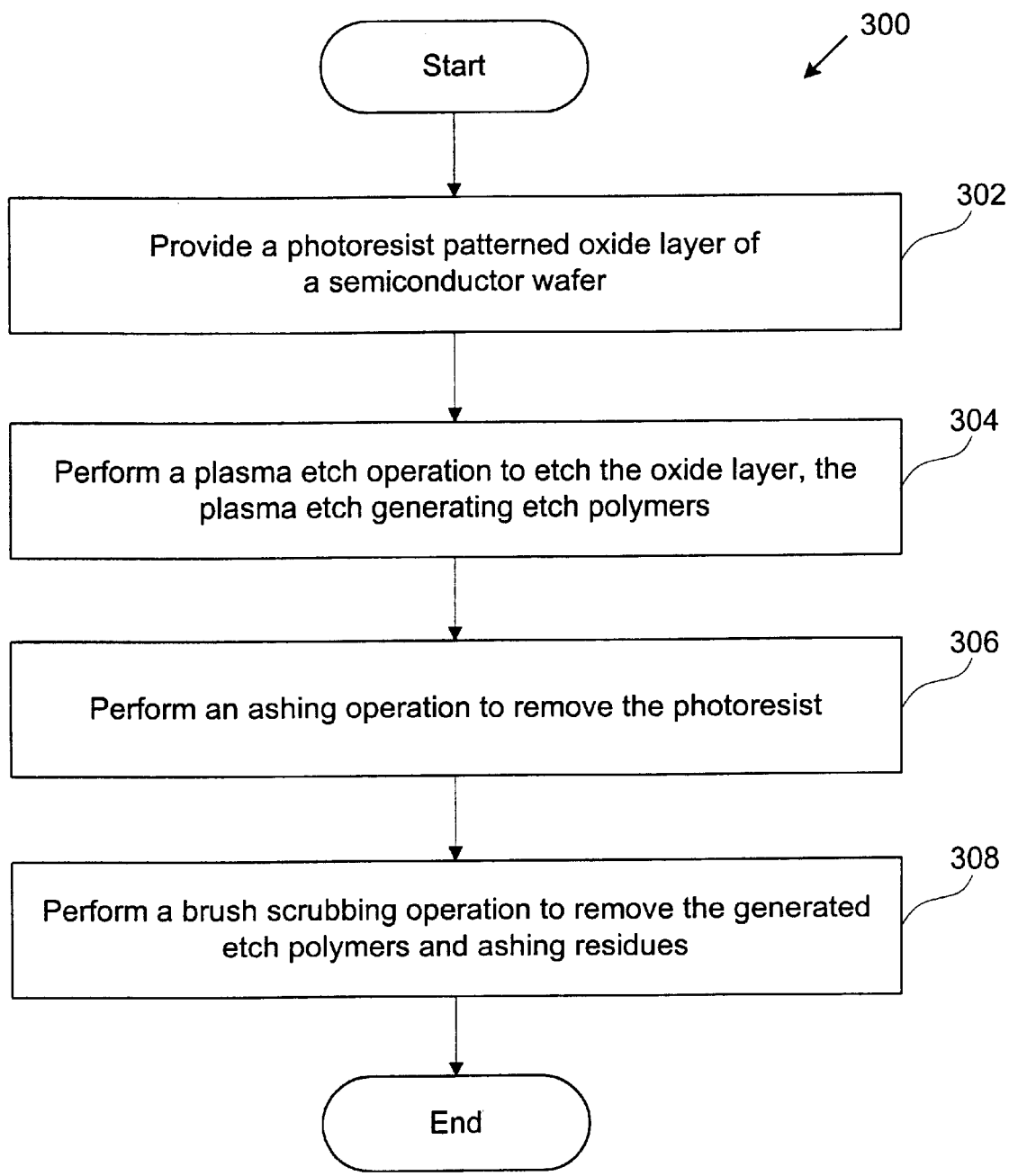
FIG. 3 illustrates a flowchart diagram defining the method operations performed when cleaning a semiconductor wafer after an etching operation has been performed, in accordance with one embodiment of the present invention.

FIG. 3 illustrates a flowchart diagram 300 defining the method operations performed when cleaning a semiconductor wafer after an etching operation has been performed, in accordance with one embodiment of the present invention. The method begins at an operation 302 where a photoresist patterned oxide layer of a semiconductor wafer is provided. As shown in FIG. 1, a semiconductor wafer may have a plurality of layers fabrication thereon, and the photoresist layer is used to pattern a desired layer. In this example, the layer requiring patterning is an oxide layer. As is well known, oxide layers are typically inorganic or organic dielectric materials which are used to insulate interconnect metallization lines between interconnect levels. The method now moves to an operation 304 where a plasma etch operation is performed to etch the oxide layer using the patterned photoresist to define etched feature regions. In one embodiment, the plasma etching may be used to perform via hole etching, contact hole etching, trenches, and other features in the oxide layer.

The plasma etch operation will typically generate a layer of polymers on the sidewalls of the etched features. The formed polymers are known to be a composition of the plasma etching chemistries, carbon from photoresist material, the oxide material being etched, and components from the material that underlies the oxide layer being etched. For example, the underlying layer may be some type of metallization layer, such as an antireflective coating (ARC).

To remove the patterned photoresist from over the patterned oxide layer, the method will move to an operation 306 where an ashing operation is performed. Ashing operations are well known and are commonly used to remove photoresist materials. When the ashing operation is complete and the photoresist material has been removed, the wafer will be processed through a brush scrubbing system in order to remove the generated etch polymers and any ashing residues in operation 308. For example, the brush scrubbing operation can be performed in a brush scrubbing station that incorporates a pair of brushes for evenly brushing each side of the processed semiconductor wafer.

In a preferred embodiment, the brush scrubbing operation will preferably implement a chemical that will assist in removing the generated etched polymers, any of the ashing residues, and other particulates or contaminants. For example, the brushing operation is designed to be performed by supplying chemicals through the brush (TTB) to allow the scrubbing of the surface for a period of between about 10 seconds and about 40 seconds. It should be noted that brush scrub cleaning in the context of post etch and ashing operations is substantially different that the conventional technique of chemical bath treatment, which is known to further contaminate a wafer with particulates.

Exemplary chemicals may include: (a) a combination of ammonia ($NH_4OH$) and de-ionized (DI) water, (b) a combination of peroxide ($H_2O_2$), hydrofluoric acid (HF), and DI water, (c) a combination of peroxide ($H_2O_2$), ammonia ($NH_4OH$), and DI water, and (d) a combination of HF and DI water. As described in a pending U.S. patent application, combination (c) of $H_2O_2$, $NH_4OH$, and DI water is referred to as "SC1." For additional information on wafer cleaning processes, reference may be made to this commonly owned U.S. patent application Ser. No. 08/792,093, filed Jan. 31, 1997, and entitled "Method And Apparatus For Cleaning Of Semiconductor Substrates Using Standard Clean 1 (SC1)." This application is hereby incorporated by reference herein.

Once the chemical application and scrubbing has been performed for the desired amount of time, the method will conclude by performing a DI water rinse through the brush in the same brush scrubbing station. It should be understood that the brush scrubbing operation that includes the delivery of chemicals followed by a DI water rinse is configured to yield a high degree of cleanliness while removing the generated etch polymers from within the etched oxide features, as well as removing other particulates and contaminants that may have been deposited during the ashing operation. Accordingly, the method of the present invention enables a very simple cleaning operation to be performed as a post-etch treatment that follows an ashing operation. Once the brush scrubbing operation 308 is performed, the wafer can be moved to further processing and the method will end.

Figure 4:
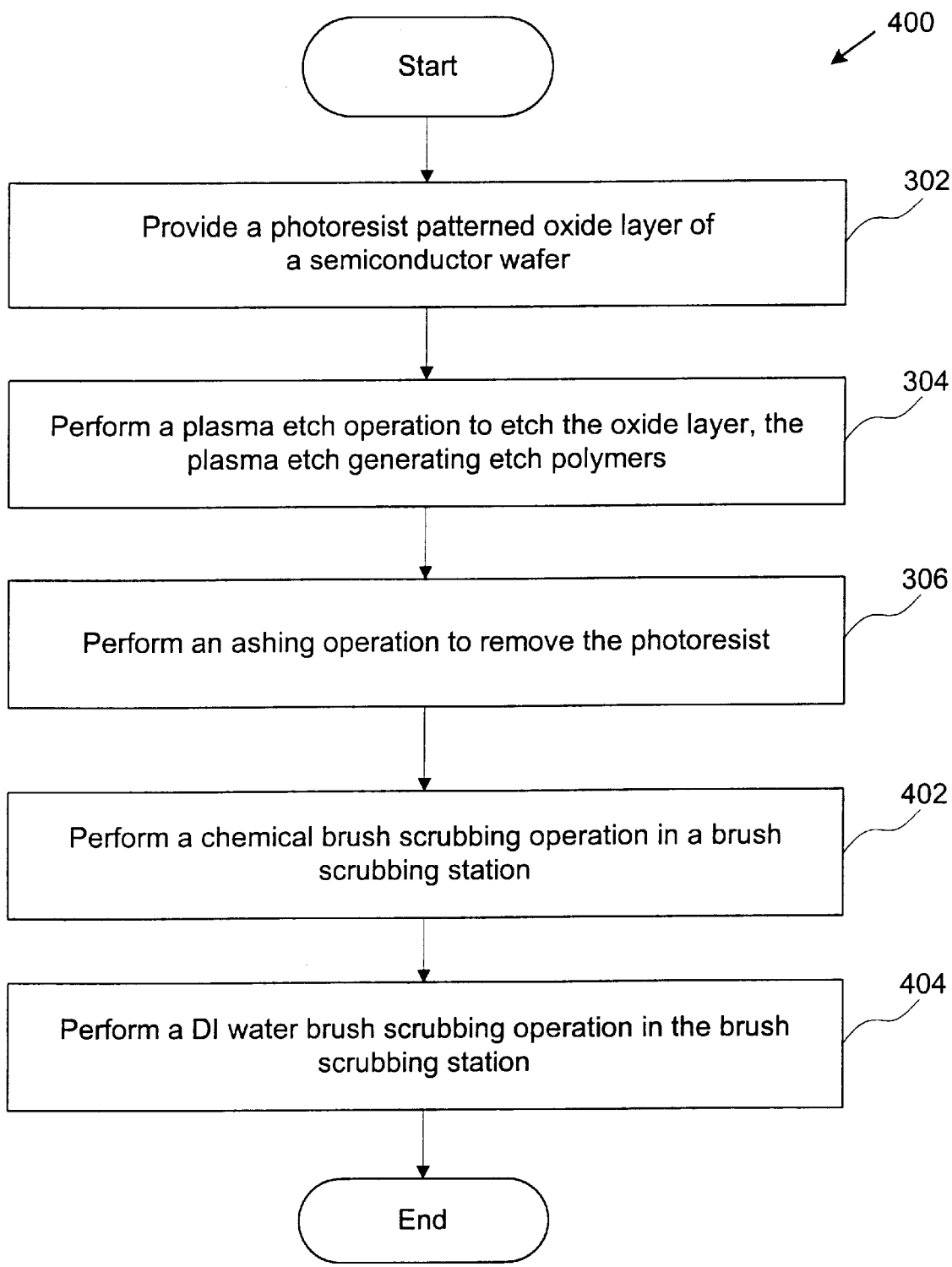
FIG. 4 illustrates a flowchart diagram defining post plasma etch cleaning, in accordance with another embodiment of the present invention.

FIG. 4 illustrates a flowchart diagram 400 in accordance with another embodiment of the present invention. In this embodiment, operations 302, 304, and 306 are again performed as described with reference to FIG. 3. Once the wafer has been processed through the ashing operation to remove the photoresist in operation 306, the wafer is moved into a brush scrubbing station in order to perform a chemical brush scrubbing operation in 402. In this preferred embodiment, the brush scrubbing operation will preferably include the application of a combination of chemicals through the brush (TTB).

For example, the combination of chemicals will include $H_2O_2$, $NH_4OH$, and deionized water, otherwise described as SC1. The preferred ratios by volume of $H_2O_2$:$NH_4OH$:DI water are preferably 10:1:120:, respectively. Typically, $NH_4OH$ is obtained as a stock solution that is about 29% $NH_4OH$ and the rest DI water. Similarly, a stock solution of $H_2O_2$ is typically about 30% $H_2O_2$ and the rest DI water. Thus, the volumetric ratio of 10:1:120 for $H_2O_2$, $NH_4OH$, and DI water will actually change accordingly when the concentrations of the stock solutions are taken into consideration.

In operation, the chemical brush scrubbing of operation 402 will preferably have an optimal flow rate for $H_2O_2$, $NH_4OH$, and DI water (e.g., SC1), and another separate flow rate for DI water. Preferably, the brush scrubbing station will have a mix manifold that will receive a flow rate of about 250 ml/minute of $H_2O_2$, $NH_4OH$, and DI water, and a flow rate of about 200 ml/minute of DI water. These two flows will thus be properly mixed in the mix manifold to dilute the chemical application to a desired level and thus apply the diluted chemical to the pair of brushes for through-the-brush scrubbing of the wafer.

In one embodiment, the optimal time for brush scrubbing in operation 402 will range between about 10 seconds and about 30 seconds, and most preferably, for about 20 seconds. Once the chemical brush scrubbing operation is complete in operation 402, the method will proceed to an operation 404 where a DI water brush scrubbing operation is performed in the same brush scrubbing station. In this operation, between about 2200 and about 3000 ml/minute is delivered to the brushes of the brush scrubbing station to perform a rinse that is configured to further remove any loose etch polymers and other residues. The DI water brush scrubbing operation 404 is also designed to flush out the chemicals from the chemical brush scrubbing operation 402 and thus ensure that the wafer is properly clean and is ready for the next fabrication operation. At this point, the method of this embodiment will end.

Figure 5:
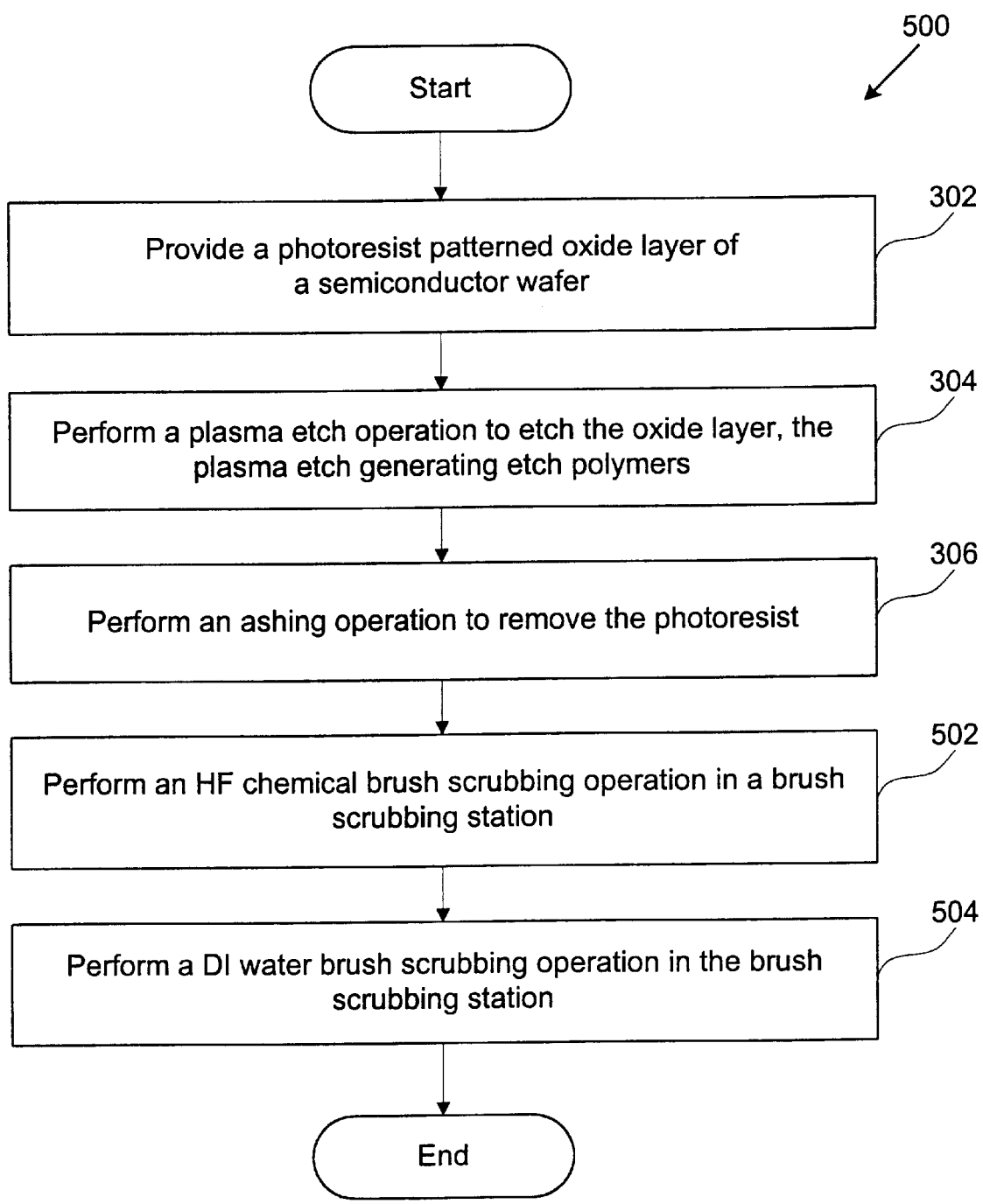
FIG. 5 illustrates a flowchart diagram defining post plasma etch cleaning, in accordance with yet another embodiment of the present invention.

FIG. 5 illustrates a flowchart diagram 500, in accordance with yet another embodiment of the present invention. Operations 302, 304, and 306 will be substantially the same as described with reference to FIGS. 3 and 4 above. The method now proceeds to an operation 502 where a hydrofluoric acid (HF) chemical brush scrubbing operation is performed in a brush scrubbing station in order to remove the generated etch polymers and any residues generated during the ashing operation.

In this embodiment, the HF chemical will be a dilute HF chemical having a concentration ratio of 100:1. That is, for every 100 parts of DI water, there will be one part of HF. However, the stock solution of HF is typically comprised of about 49% pure BF by volume. Accordingly, the true concentration ratio of DI water to HF is actually about 100:0.5. In operation, the dilute HF solution is then provided to a mix manifold at about 250 ml/minute in addition to a flow of DI water of about 900 ml/minute. The flows of the dilute HF and the DI water will thus be mixed in a mix manifold before being applied to the brushes in the brush scrubbing station. In a preferred embodiment, the brush scrubbing operation will be performed for between about 20 seconds and about 40 seconds, and most preferably, for about 30 seconds.

In general, the BF chemical brush scrubbing operation will be performed with care such that the HF will not attack the underlying layers. Once the HF brush scrubbing operation is performed in operation 502, the method will move to an operation 504 where a DI water brush scrubbing operation is performed in the brush scrubbing station. In this embodiment, between about 2200 and about 3000 ml/minute is passed to the brushes in the brush station to flush out any loose contaminants, particulates, as wells as any HF chemical solution from the brushes. This DI water brush scrubbing operation of 504 is thus configured to ensure that the surface of the wafer is left in a clean state before proceeding to further fabrication of other layers.

Figure 6:
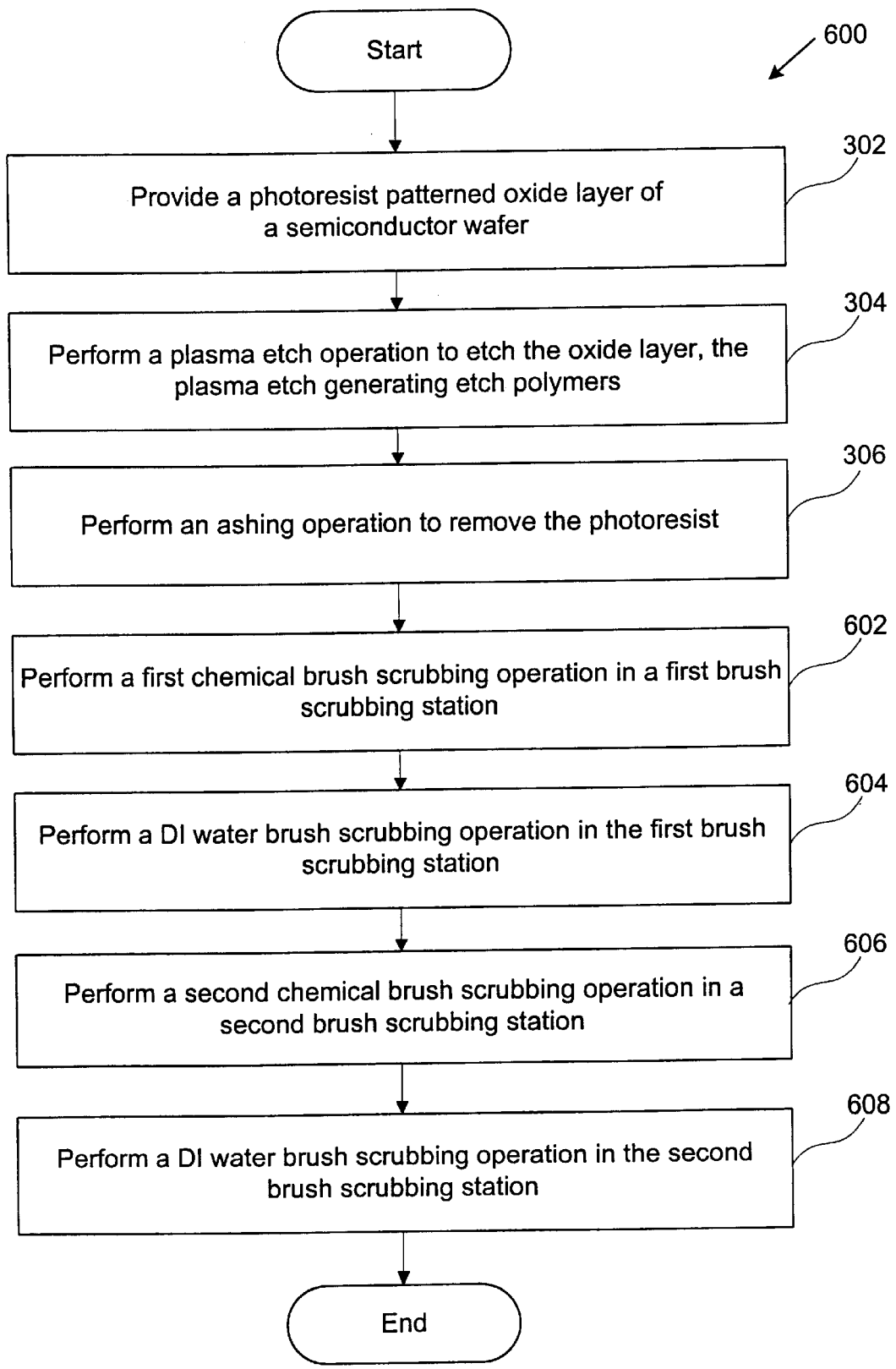
FIG. 6 illustrates a flowchart diagram defining post plasma etch cleaning, in accordance with still another embodiment of the present invention.

FIG. 6 illustrates a flowchart diagram 600, in accordance with still another embodiment of the present invention. In this embodiment, the method operations 302, 304, and 306 will be substantially the same as described above. In this embodiment, it is contemplated that a brush scrubbing system will include a first brush scrubbing station and a second brush scrubbing station. By way of example, the brush scrubbing system may be similar to that described with reference to FIGS. 1B and 1C above, or two vertical brush scrubbers.

Accordingly, method proceeds to an operation 602 where a first chemical brush scrubbing operation is performed in a first brush scrubbing station. In this first chemical brush scrubbing operation, it is preferred that a chemical including $H_2O_2$, $NH_4OH$, and DI water (e.g., SC1) having a volumetric ratio of 10:1:120, respectively, be used TTB during the scrub operation. As mentioned above, the stock solution of $NH_4OH$ is typically about 29% $NH_4OH$ and the stock solution for $H_2O_2$ is typically about 30% $H_2O_2$. Thus, the volumetric ratio 10:1:120 will be appropriately modified depending upon the stock solution used.

In any event, the optimal flow for performing the first chemical brush scrubbing operation will be to apply about 250 ml per minute of SC1 (e.g., $H_2O_2$, $NH_4OH$, DI water), and about 200 ml per minute of DI water by way of a mix manifold. This diluted solution is thus applied to the brushes to perform the first brush scrubbing operation in the first brush scrubbing station for a period of between about 10 seconds and about 30 seconds. Once the first chemical brush scrubbing operation is performed in operation 602, the method will proceed to an operation 604 where a DI water brush scrubbing operation is performed in the same first brush scrubbing station. Preferably, the brushes are flushed with a flow ranging between about 2200 and about 3000 ml per minute of DI water. Once the DI water brush scrubbing operation is complete in operation 604, the method will proceed to an operation 606 where a second chemical brush scrubbing operation is performed in a second brush scrubbing station.

Accordingly, the wafer will have to be moved between the first brush scrubbing station and the second brush scrubbing station in order to perform the second chemical brush scrubbing operation. The second chemical brush scrubbing operation will preferably include the application of a dilute HF chemical having a volumetric concentration ratio of about 100:1, where the stock HF solution is about 49% HF by volume. Preferably, the dilute HF solution is applied at a flow rate of about 250 ml per minute, and is combined with a flow rate of DI water of about 900 ml per minute which is provided by way of a mix manifold. The mix manifold will then deliver the appropriately diluted HF solution to the brushes of the second brush scrubbing station for application to the wafer. Preferably, the brush scrubbing operation will range in time between about 20 seconds and about 40 seconds, and most preferably for about 30 seconds.

Once the second chemical brush scrubbing operation is complete in operation 606, the method will proceed to an operation 608 where a DI water brush scrubbing operation is performed in the same second brush scrubbing station. This DI water brush scrubbing operation will be configured to deliver between about 2200 and about 300 ml/minute of DI water through the brush (TTB) to complete the cleaning of the wafer.

It is again noted that the present invention can be modified to scrub any number of substrate types, for example, semiconductor wafers, flat panel displays, and the like. Additionally, the methods of the present invention are equally applicable to cleaning any size wafer, for example, 100 mm wafers, 200 mm wafers, 300 mm wafers, smaller wafers, larger wafers, etc.

For additional information on wafer preparing systems and techniques, reference may be made to commonly owned U.S. patent application numbers: (1) Ser. No. 08/542,531, filed Oct. 13, 1995, entitled "Method and Apparatus for Chemical Delivery Through the Brush," and (2) Ser. No. 09/277,712, filed Mar. 26, 1999, entitled "Pressure Fluctuation Dampening System." Both U.S. patent applications are hereby incorporated by reference.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for cleaning a semiconductor wafer, comprising:
    plasma etching a feature into an oxide layer having a photoresist mask;
    ashing the semiconductor wafer to remove the photoresist mask; and
    scrubbing a surface of the semiconductor wafer using a porous brush that is configured to deliver chemicals to the surface, the surface having oxide-plasma etch resultant polymer residues deposited in and around side walls of the feature during the plasma etching.

2. A method for cleaning a semiconductor wafer as recited in claim 1, wherein the chemicals are selected from one of (a) a combination of $NH_4OH$ and DI water, (b) a combination of $H_2O_2$, HF, and DI water, (c) a combination of $H_2O_2$, $NH_4OH$, and DI water, and (d) a combination of HF and DI water.

3. A method for cleaning a semiconductor wafer as recited in claim 2, wherein the combination of $H_2O_2$, $NH_4OH$, and DI water has a concentration ratio of about 10:1:120.

4. A method for cleaning a semiconductor wafer as recited in claim 3, wherein the combination of $H_2O_2$, $NH_4OH$, and DI water is delivered to a mix manifold of a brush scrubbing station at a flow rate of 250 ml/minute along with a delivery of a second DI water source at a flow rate of about 200 ml/minute, the mix manifold being configured to deliver a chemical fluid to brushes of the brush scrubbing station to perform the scrubbing of the semiconductor wafer.

5. A method for cleaning a semiconductor wafer as recited in claim 4, wherein the scrubbing is performed for a time ranging between about 10 seconds and about 30 seconds.

6. A method for cleaning a semiconductor wafer as recited in claim 5, further comprising:
    scrubbing the semiconductor wafer with a DI water rinse following the scrubbing with the chemicals.

7. A method for cleaning a semiconductor wafer as recited in claim 2, wherein the combination ratio of HF and DI water has a concentration ratio of about 1:100.

8. A method for cleaning a semiconductor wafer as recited in claim 7, wherein the combination of HF and DI water is delivered to a mix manifold of a brush scrubbing station at a flow rate of 250 ml/minute along with a delivery of a second DI water source at a flow rate of about 900 ml/minute, the mix manifold being configured to deliver a chemical fluid to brushes of the brush scrubbing station to perform the scrubbing of the semiconductor wafer.

9. A method for cleaning a semiconductor wafer as recited in claim 8, wherein the scrubbing is performed for a time ranging between about 20 seconds and about 40 seconds.

10. A method for cleaning a semiconductor wafer as recited in claim 9, further comprising:
    scrubbing the semiconductor wafer with a DI water rinse following the scrubbing with the chemicals.

11. A method for post plasma etch cleaning a semiconductor wafer, the semiconductor wafer having a plurality of layers formed thereon, one of the plurality of layers being an oxide layer, the oxide layer having photoresist mask, comprising:
    plasma etching a feature in the oxide layer, the plasma etching being configured to generate a polymer film on sidewalls of the plasma etched feature;
    performing an ashing operation to remove the photoresist mask; and
    brush scrubbing the oxide layer and the plasma etched feature with chemicals followed by a DI water rinse, the chemicals being a combination of $H_2O_2$, $NH_4OH$, and DI water, wherein the brush scrubbing with the $H_2O_2$, $NH_4OH$, and DI water is performed for a period of time ranging between about 10 seconds and about 30 seconds;
    whereby the brush scrubbing with the chemicals followed by the DI water rinse is configured to remove the polymer film from the sidewalls of the plasma etched feature.

12. A method for post plasma etch cleaning a semiconductor wafer as recited in claim 11, further comprising:
    performing a second brush scrubbing operation on the oxide layer and the plasma etched feature with second chemicals followed by a second DI water rinse, the second chemicals being a combination of HF and DI water.

13. A method for post plasma etch cleaning a semiconductor wafer as recited in claim 12, wherein the second brush scrubbing with the HF and DI water is performed for a period of time ranging between about 20 seconds and about 40 seconds.

14. A method for post plasma etch cleaning a semiconductor wafer as recited in claim 13, wherein the HF and DI water has a concentration ratio of about 1:100.

15. A method for post plasma etch cleaning a semiconductor wafer as recited in claim 14, wherein the HF and DI water is delivered to a mix manifold of a brush scrubbing station at a flow rate of 250 ml/minute along with a delivery of a second DI water source at a flow rate of about 900 ml/minute, the mix manifold being configured to deliver a chemical fluid to brushes of the brush scrubbing station to perform the second brush scrubbing of the semiconductor wafer.

16. A method for post plasma etch cleaning a semiconductor wafer as recited in claim 11, wherein the $H_2O_2$, $NH_4OH$, and DI water has a concentration ratio of about 10:1:120.

17. A method for post plasma etch cleaning a semiconductor wafer as recited in claim 16, wherein the $H_2O_2$, $NH_4OH$, and DI water is delivered to a mix manifold of a brush scrubbing station at a flow rate of 250 ml/minute along with a delivery of a second DI water source at a flow rate of about 200 ml/minute, the mix manifold being configured to deliver a chemical fluid to brushes of the brush scrubbing station to perform the brush scrubbing of the semiconductor wafer.

18. A method for post plasma etch cleaning a semiconductor wafer, the semiconductor wafer having a plurality of layers formed thereon, one of the plurality of layers being an oxide layer, the oxide layer having photoresist mask, comprising:

plasma etching a via feature in the oxide layer, the plasma etching being configured to generate a polymer film on sidewalls of the via feature;

performing an ashing operation to remove the photoresist mask; and brush scrubbing the oxide layer and the via feature defined in the oxide layer with first chemicals in a first brush station;

brush scrubbing the oxide layer and the via feature with DI water in the first brush station;

brush scrubbing the oxide layer and the via feature with second chemicals in a second brush station; and brush scrubbing the oxide layer and the via feature with DI water in the second brush station; the brush scrubbing in the first and second brush stations being configured to remove the polymer film from the side walls of the via feature;

wherein the brush scrubbing using the first chemicals is performed for a period of time ranging between about 10 and 30 seconds and the scrubbing using the second chemicals is performed for a period of time ranging between about 20 and 40 seconds.

19. A method for post plasma etch cleaning a semiconductor wafer as recited in claim 18, wherein the first chemicals include a combination of $H_2O_2$, $NH_4OH$, and DI water, and the second chemicals include a combination of HF and DI water.

20. A method for post plasma etch cleaning a semiconductor wafer as recited in claim 19, wherein the $H_2O_2$, $NH_4OH$, and DI water has a concentration ratio of about 10:1:120 and the HF and DI water has a concentration ratio of about 1:100.

21. A method for cleaning a semiconductor wafer, comprising:

plasma etching a feature in an oxide layer having a photoresist mask;

ashing the semiconductor wafer to remove the photoresist mask; and scrubbing the semiconductor wafer implementing a chemical combination of $H_2O_2$, $NH_4OH$, and DI water having a concentration ratio of about 10:1:120, the chemical combination that is configured to remove polymer residues deposited in the feature during the plasma etching.

22. A method for cleaning a semiconductor wafer, comprising:

plasma etching a feature in an oxide layer having a photoresist mask;

ashing the semiconductor wafer to remove the photoresist mask; and scrubbing the semiconductor wafer implementing a chemical combination of HF and DI water having a concentration ratio of about 1:100, the chemical combination is configured to remove polymer residues deposited in the feature during the plasma etching.

* * * * *